United States Patent [19]
Williams et al.

[11] Patent Number: 5,889,252
[45] Date of Patent: Mar. 30, 1999

[54] METHOD OF AND APPARATUS FOR INDEPENDENTLY CONTROLLING ELECTRIC PARAMETERS OF AN IMPEDANCE MATCHING NETWORK

[75] Inventors: Norman Williams; Russell F. Jewett, Jr., both of Newark, Calif.

[73] Assignee: LAM Research Corporation, Fremont, Calif.

[21] Appl. No.: 770,622

[22] Filed: Dec. 19, 1996

[51] Int. Cl.[6] .................................................. B23K 10/00
[52] U.S. Cl. ................... 219/121.54; 219/121.57; 219/121.43; 156/345; 216/67; 333/17.3
[58] Field of Search .................. 219/121.54, 121.57, 219/121.43, 121.41; 156/345, 643.1, 646.1, 627.1; 204/298.34, 298.37, 298.38, 298.31, 298.32; 216/59–67

[56] References Cited

U.S. PATENT DOCUMENTS

| | | |
|---|---|---|
| 3,443,231 | 5/1969 | Roza . |
| 3,616,405 | 10/1971 | Beaudry ............................ 204/298.32 |
| 4,112,395 | 9/1978 | Seward . |
| 4,679,007 | 7/1987 | Reese et al. . |
| 5,286,941 | 2/1994 | Bel ......................................... 219/778 |
| 5,325,019 | 6/1994 | Miller et al. ........................ 315/111.21 |
| 5,427,645 | 6/1995 | Lovin ...................................... 156/367 |
| 5,472,561 | 12/1995 | Williams et al. ..................... 156/627.1 |
| 5,521,351 | 5/1996 | Mahoney ........................... 219/121.59 |
| 5,556,501 | 9/1996 | Collins et al. .......................... 156/345 |
| 5,556,549 | 9/1996 | Patrick et al. ............................ 216/61 |
| 5,631,611 | 5/1997 | Luu . |

Primary Examiner—Mark H. Paschall
Attorney, Agent, or Firm—Lowe Hauptman Gopstein Gilman & Berner

[57] ABSTRACT

An arrangement and method for matching a load and a power source, such as an r.f. power source for a vacuum plasma processing chamber, includes a match network coupled between the power source and the load. The match network has at least two controllably variable electrical characteristics. A sensor is provided that senses at least two parameters of the load. A drive controller responds to the sensed parameters of the load to independently control varying a first one of the electrical characteristics of the match network as a function of only one of the parameters of the load, and a second one of the electrical characteristics of the match network as a function of another one of the parameters of the load. This is done until the power source and the load are in a matched condition. The separation of the match variables to establish a nearly one-to-one correspondence with the load parameters allows independent adjustment of the match variables to provide fast and unambiguous reaching of the matched condition.

28 Claims, 7 Drawing Sheets

METHOD OF AND APPARATUS FOR INDEPENDENTLY CONTROLLING ELECTRIC PARAMETERS OF AN IMPEDANCE MATCHING NETWORK

FIELD OF THE INVENTION

The present invention relates to the field of r.f. delivery systems, and more particularly, to the field of multivariable network control systems for match networks of r.f. power delivery systems.

BACKGROUND ART

Vacuum plasma processing chambers are employed for processing workpieces, typically glass, semiconductor or metal substrates, so the workpiece is etched and/or has materials deposited thereon. Significant amounts of r.f. power must be supplied to the vacuum plasma processing chamber to excite ions in a gas in the chamber to a plasma and to maintain the plasma in a discharge state. The impedance of a load of the vacuum plasma processing chamber, including the plasma discharge and an excitation circuit component for it, usually a coil or one or more electrodes, varies non-linearly and unpredictably. For example, the quality factor (Q) of an excitation coil prior to ignition of the plasma is typically quite high, about 100–400. After ignition, the Q of the coil and its plasma load drops to about 10–20. Properties of the plasma also cause the reactive impedance seen looking into the matching network to decrease as a power matched condition is approached and reached. The resistive impedance results, to a large extent, from the charged carriers in the plasma. Hence, matching to a plasma presents particular problems due to these variations in the resistive (real) and reactive (imaginary) impedance components of the load seen looking into the matching network driving the excitation circuit element and plasma of a vacuum plasma processing chamber.

The matching network is intended to (1) maximize power supplied to the load, for efficiency, and (2) minimize power reflected from the load to a relatively high power r.f. excitation source, for efficiency and prevention of possible source damage. The matching network is connected between the excitation circuit components and an output terminal of a relatively long cable (e.g., greater than 10 feet) driven by the source. The source has a specified output impedance, such as 50 ohms resistive, and zero ohms reactive. The source output impedance equals the cable characteristic impedance. The matching network is supposed to match the impedance of the load to that of the source by adjusting the impedance seen by the source so it equals the source resistive impedance.

Typically, the matching network includes two variable reactances, one for primarily controlling the resistive impedance component ($|Z|$) seen looking into the matching network and a second for primarily controlling the reactive impedance component ($\phi$) seen looking into the matching network. In one prior art arrangement, the variable reactances are automatically simultaneously adjusted in an attempt to minimize reflected power. The most commonly used technique for controlling the values of the variable reactances involves detecting the phase and magnitude of the impedance seen looking into the input terminals of the matching network. The automatic simultaneous adjustment according to the prior art, however, is imprecise and relatively slow to achieve a matched condition, for the reasons discussed below.

In general, the control surfaces of ($|Z|$) and $\phi$ in the space of the match network variables are complicated such that there is not a one-to-one correspondence between ($|Z|$) and $\phi$ and the two match variables. In other words, changing one of the match network variables so that, for example, ($|Z|$) is made to equal 50 ohms, will also have an effect on the value of $\phi$. The same holds true when changing a match network variable to make $\phi$ equal to 0°, since there is not a one-to-one correspondence between ($|Z|$) and $\phi$ and the two match variables. Hence, attempting to adjust both match variables simultaneously in the prior art was difficult, since a change in one match variable would have an effect on the other match variable. This lack of correspondence leads to slowness in matching and a failure to match due to ambiguities in the surface shapes of ($|Z|$) and $\phi$.

SUMMARY OF THE INVENTION

There is a need for a method and apparatus for independently adjusting the match variables of a match network so that precise and fast matching of the variable load is accomplished.

This and other needs are met by embodiments of the present invention, which provides an arrangement for matching a load to a power source. The arrangement includes a match network coupled between a power source and a load, the match network having at least two controllably variable electrical characteristics. A sensor is provided that senses at least two parameters of the load. A drive controller responds to the sensed parameters of the load to independently control varying a first one of the electrical characteristics of the match network as a function of one of the parameters of the load and a second one of the electrical characteristics of the match network as a function of another one of the parameters of the load until the power source and the load are matched.

Since the drive controller independently controls the varying of first and second electrical characteristics as respective functions of first and second load parameters, fast and precise matching is accomplished. This is an advantage over the prior art in which the match variables (the variable electrical characteristics) of the match network do not have a one-to-one correspondence with the load parameters, which makes matching relatively slow and ambiguous.

The earlier stated needs are also met by another embodiment of the present invention which provides a method of matching a load to a power source with a match network having a primary circuit and a secondary circuit. This method comprises the steps of establishing a resonant condition in the primary circuit and measuring at least two parameters of the load. A control variable is calculated from at least one of the two parameters. It is then determined whether a first one of the load parameters is equal to a first specified value based on the value of the control variable. A first match variable of the match network is adjusted to drive the control variable such that the first load parameter is equal to the first specified value. It is then determined whether a second one of the load parameters is equal to a second specified value. A second match variable of the match network is adjusted to drive the match variable such that the second load parameter is equal to the second specified value, wherein the first match variable has a one-to-one correspondence with the first load parameter and the second match variable has a one-to-one correspondence with the second load parameter.

The earlier stated needs are also met by another embodiment of the present invention which provides a method of matching a load to a power source with a match network having a primary circuit and a secondary circuit, comprising the steps of measuring at least two parameters of the load, transforming the two parameters of the load into first and second orthogonal functions, and simultaneously and independently adjusting a first match variable of the match network to drive the value of the first function to the first specified value, and a second match variable of the match network to drive the value of the second function to the second specified value.

The foregoing and other features, aspects and advantages of the present invention will become more apparent from the following detailed description of the present invention when taken in conjunction with the accompanying drawings.

DETAILED DESCRIPTION OF THE EXEMPLARY EMBODIMENTS

Figure 1:
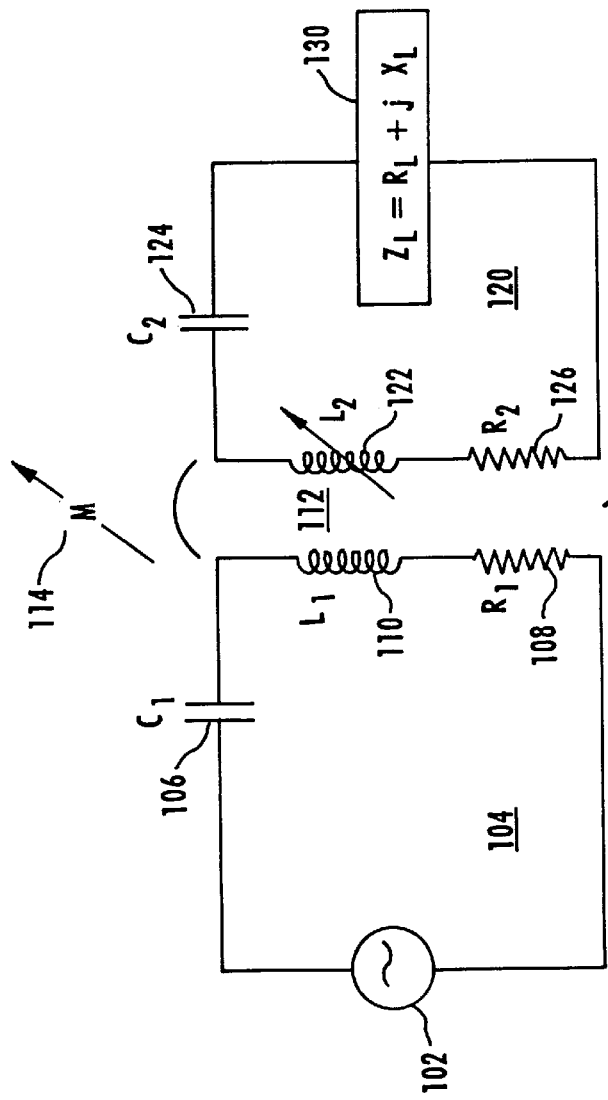
FIG. 1 is a schematic depiction of a match network constructed in accordance with an embodiment of the present invention.

FIG. 1 is a schematic depiction of a power delivery system with a match network employed in certain exemplary embodiments of the present invention for matching a capacitive load. In other embodiments, however, systems other than that shown in FIG. 1 are controlled in accordance with the present invention. In the exemplary system of FIG. 1, the r.f. generator 102 produces alternating current and voltage, and transfers the voltage and current via a primary circuit 104, a match network 100, and a secondary circuit 120 to a load 130. The load 130 may be a vacuum processing chamber, for example.

The primary circuit 104 includes the rf generator 102, a capacitance $C_1$ 106, a resistance $R_1$ 108, and an inductance $L_1$ 110 that serves as the primary side of a transformer 112. The capacitance $C_1$ 106, resistance $R_1$ 108, and inductance $L_1$ 110, are measurable quantities. The transformer 112 has a controllable mutual inductance M 114 and a controllable secondary inductance $L_2$ 122. The controllable secondary inductance $L_2$ 122 is part of a secondary circuit 120, and is in series with a secondary capacitance $C_2$ 124 and a load impedance $Z_L$ of a vacuum plasma processing chamber coupled to the secondary circuit 120.

The power supplied to load 130 and match network 100 by the arrangement of FIG. 1 includes a voltage and current represented by the magnitude ratio $Z_{in}$ (where $|Z_{in}| =$ $$Z_{in} \left( \text{where } |Z_{in}| = \left| \frac{V_{in}}{I_{in}} \right| \text{ and } Z_{in} = R_{in} + jX_{in}, \right.$$
$$\left. \text{where } R_{in} = |Z_{in}|\cos\phi_{in} \text{ and } X_{in} = |Z_{in}|\sin\phi_{in} \right)$$

and $Z_{in} = R_{in} + jX_{in}$, where $R_{in} = |Z_{in}|\cos\theta_{in}$ and $X_{in} = |Z_{in}|\sin\theta_{in}$) and a phase angle $\theta_{in}$. A phase/magnitude sensor (described later) measures $Z_{in}$ and $\theta_{in}$. The impedance $Z_{in}$ and the phase $\theta_{in}$ are determined by the load 130 characteristics, the primary capacitance $C_1$ 106, the primary intrinsic resistance $R_1$ 108, the primary inductance $L_1$ 110, the frequency $\omega$, the secondary capacitance $C_2$ 124, the mutual inductance M 114, and the secondary inductance $L_2$ 122. The mutual inductance M 114 and the secondary inductance $L_2$ 122 are adjustable in real time to vary $Z_{in}$ and $\theta_{in}$, while the other values of the circuit are constant over time. Exemplary values of the components in the schematic of FIG. 1 are: $L_1 = 1.27$ $\mu$H; $C_1 = 160$ pF; $R_1 = 0.4\Omega$; $L_2 = 1.8 - 2.8$ $\mu$H; $C_2 = 75$ pF; $R_2 = 0.8\Omega$; $0 < X_L < 100\Omega$. The mutual inductance M and the variable inductance $L_2$ are adjusted using drive motors that vary the inductances. The motors are driven according to a magnitude error signal (the deviation of $|Z_{in}|$ from 50 ohms) and the phase error signal (the deviation of $\phi$ from zero degrees). In the prior art, the error signals are both dependent on both match variables, such as M and $L_2$. Hence, a change in $|Z_{in}|$ required a change in both M and $L_2$ to compensate. This lack of orthogonality resulted in extensive searching of M and $L_2$ to obtain a matched condition and may extend the matching time required to several seconds.

The present invention mitigates this problem by making the measured error signals have a nearly one-to-one correspondence with the match variables, as described below. The changes in $|Z_{in}|$ or $\phi$ then require compensation by the adjustment of only one of the match variables each, thereby achieving precise and rapid matching.

A first exemplary embodiment provides a method for controlling the match variables M and $L_2$ to drive $|Z_{in}|$ to 50 ohms and to drive $\phi_{in}$ to zero degrees. The first step in this exemplary embodiment is the reduction of the set of equations as described below.

Equations 1 and 2 provide the real and imaginary parts of the input impedance of the match connected to a load $Z_L = R_T + j \cdot X_L$, where $R_T$ is the sum of the load impedance $R_L$ plus the residual match resistance $R_2$:

$$Re(Z_{in}) = R_1 + \frac{(\omega \cdot M)^2 \cdot R_T}{R_T^2 + \alpha^2} \quad (1)$$

$$Im(Z_{in}) = \left( \omega \cdot L_1 - \frac{1}{\omega \cdot C_1} \right) - \frac{(\omega \cdot M)^2 \cdot \alpha}{R_T^2 + \alpha^2} \quad (2)$$

where $$\alpha = \omega \cdot L_2 - \frac{1}{\omega \cdot C_2} + X_L \quad (3)$$

The phase of the input impedance as measured by the phase/magnitude detector is given by:

$$\phi_{in} = a\tan\left( \frac{Im(Z_{in})}{Re(Z_{in})} \right) \quad (4)$$

and the magnitude of the input impedance is:

$$|Z_{in}| = \sqrt{(Re(Z_{in}))^2 + (Im(Z_{in}))^2} \quad (5)$$

These equations define two components (either $Re(Z_{in})$ and $Im(Z_{in})$, or $|Z_{in}|$ and $\phi_{in}$) of input impedance and an intermediate variable $\alpha$ that are dependent on various constants (R1, $\omega$, $L_1$, $C_1$, and $C_2$) and four variables (M, $R_T$, $L_2$, and $X_L$).

Thus, in the first step of the exemplary embodiment of the invention, equation (1) and equation (2) are reduced to a set of two equations in four unknowns (M, $L_2$, $R_T$, and $\alpha$). Since $\alpha$ is a function of $L_2$ and $X_L$, equations (1) and (2) can be reduced to a set of two equations in four variables (M, $L_2$, $R_T$, and $X_L$). However, as is evident from the reduced equations, the quantities $\{|Z_{in}|$–50 ohms$\}$ and $\{\phi_{in}$–zero degrees$\}$ are not orthogonal to the match variables M and $L_2$. In other words, if either $|Z_{in}|$ or $\phi_{in}$ alone were to change, then both M and $L_2$ would require adjustment.

The first exemplary embodiment of the invention solves this problem by making the primary circuit 104 resonant. Ordinarily, resonance in the primary is avoided, since resonant circuit elements store and return power in a way that causes current to increase rapidly, potentially damaging the circuit elements. However, modern r.f. generators are able to detect an overcurrent condition and prevent damage to sensitive circuit elements, so that resonance no longer presents a significant danger. If $C_1$ 106 in the circuit of FIG. 1 is changed from 160 pF to 108.5 pF, as in certain exemplary embodiments of the present invention, a resonant condition is reached in the depicted circuit. This is exemplary only, however, as other values for the circuit elements will also create a resonant condition. The tangent of the phase angle $\phi_{in}$ is given by combining equations (1), (2), and (4):

$$\tan(\phi_{in}) = \frac{\left(\omega \cdot L_1 - \frac{1}{\omega \cdot C_1}\right) - \frac{(\omega \cdot M)^2 \cdot \alpha}{R_T^2 + \alpha^2}}{R_1 + \frac{(\omega \cdot M)^2 \cdot R_T}{R_T^2 + \alpha^2}} \quad (6)$$

Equation (6) demonstrates that the tan $\phi$=0 contour is clearly dependent on both match variables M and $L_2$ (through $\alpha$). However, according to the present invention, the primary circuit is made to be resonant. As a result, tan $\phi$=0 is then independent of M and $L_2$ since:

$$\omega \cdot L_1 - \frac{1}{\omega \cdot C_1} = 0 \quad (7)$$

and $$\alpha = \omega \cdot L_2 - \frac{1}{\omega \cdot C_2} + X_L \quad (8)$$

Accordingly, the match variable M is determined solely by the condition that $|Z_{in}|$=50 ohms. From equation (1), this leads to the condition:

$$\frac{(\omega \cdot M)^2}{R_T} = 50 - R_1 \quad (9)$$

By making the primary circuit resonant, the $\phi$=0 contour is made independent of match variable M. Thus, the matched condition can be reached by varying $L_2$ alone to make $\phi$=0, and then varying M alone to make $|Z_{in}|$=50 ohms. Since both match variables M and $L_2$ have a one-to-one correspondence with $\phi$ and $|Z_{in}|$, matching is accomplished very quickly and reliably.

Figure 2:
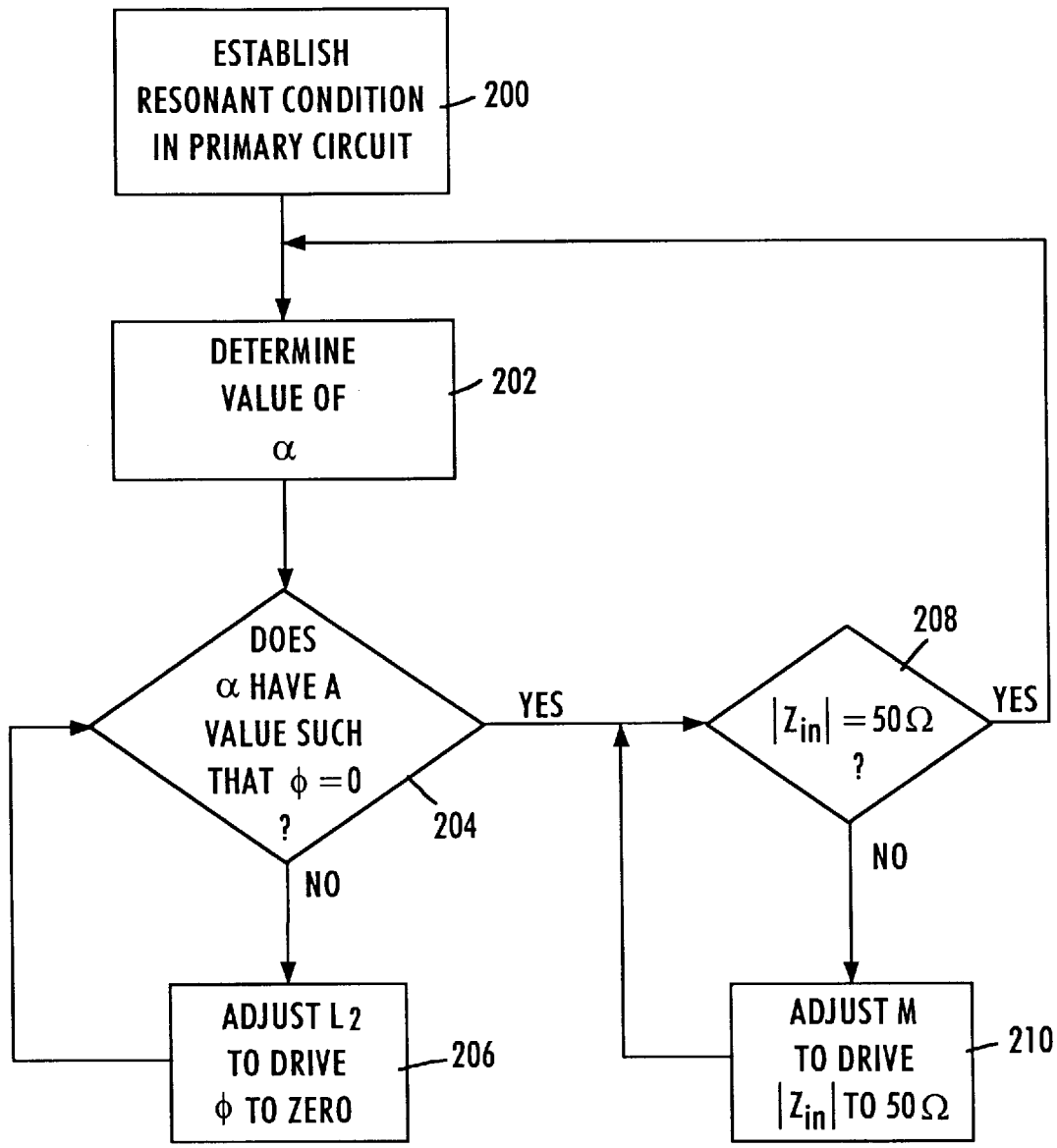
FIG. 2 is a flow chart of a method of matching a load in accordance with an embodiment of the present invention.

An embodiment of a method of adjusting the match network according to the present invention in accordance with the equations described above is depicted in FIG. 2. In step 200, a resonant condition in the primary circuit of a match network is established. This step involves providing components whose values establish a resonant condition. Once the resonant condition is established in the primary circuit, the match variables are adjusted to match the resistive and reactive impedances of the input as the output. First, in step 202, the value of $\alpha$ is determined. If $\alpha$ has a value such that $\phi$ is not equal to zero, as determined in step 204, then $L_2$ (the secondary inductance) is adjusted to drive $\phi$ to zero (step 206). This is done, in exemplary embodiments, by driving a motor that adjusts $L_2$. Once $L_2$ has been adjusted, then it is determined in step 208 whether $|Z_{in}|$=50 ohms. If not, then the mutual inductance M is adjusted (by driving another motor, for example) to drive $|Z_{in}|$ to 50 ohms, in step 210. When $|Z_{in}|$=50 ohms, then the match condition is achieved. Control returns to step 202 and the process is repeated, in order to maintain the matched condition.

Figure 3:
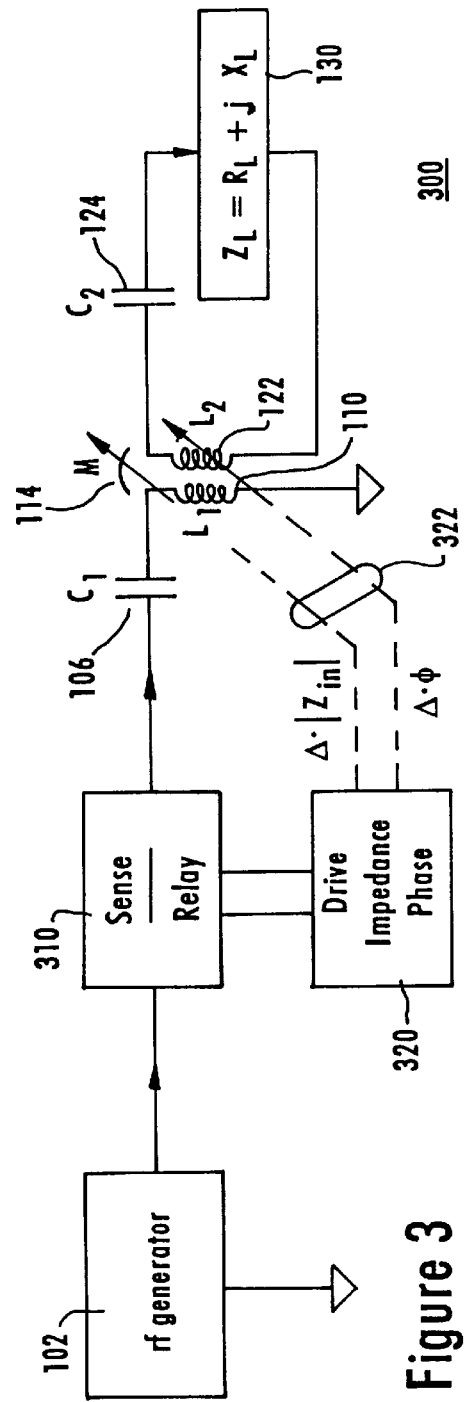
FIG. 3 is a schematic depiction of a control system for the match network of FIG. 1.

Another exemplary embodiment of the match network and control system is depicted in FIG. 3. In addition to the components already depicted in FIG. 1, the control system includes a sensor 310 and a drive impedance controller 320. The phase/magnitude sensor 310 determines the magnitude of the impedance seen looking from generator 102 into the matching network 100, $|Z_{in}|$, and the phase angle between the voltage and current flowing into the matching network, $\phi$. These values are provided to the drive impedance controller 320, which drives the motors to adjust the mutual inductance M and the secondary inductance $L_2$, so that $|Z_{in}|$ is made equal to 50 ohms and $\phi$ is made equal to zero.

Another embodiment of the present invention also employs the physical structure of FIG. 3 to adjust and match the resistive and reactive impedances. However, in this alternate embodiment, the primary is not made resonant as in the embodiment of FIG. 2. Instead, the measured phase and magnitude values are converted by a transformation into quantities which have a one-to-one correspondence with match variables. An advantage of this embodiment, described more fully below, is that the two match variables may be changed simultaneously to reach the matched condition. This is in contrast to the first embodiment of FIG. 2, in which one match variable is adjusted, and only then is the other match variable adjusted. Hence, since both match variables are adjusted simultaneously in this alternate embodiment, an even faster matching is achieved.

In the embodiment of the method depicted in FIG. 4, the measured variables of $|Z_{in}|$ and $\phi$ and other fixed attributes of the match network are used to generate two orthogonal functions which can be plotted in the space of M and $L_2$ as follows.

Equations (1) and (2) are written as:

$$Re(Z_{in}) - R_1 = \frac{(\omega \cdot M)^2 \cdot R_T}{R_T^2 + \alpha^2} = \gamma \quad (10)$$

$$Im(Z_{in}) - X_P = \frac{-(\omega \cdot M)^2 \cdot \alpha}{R_T^2 + \alpha^2} = -\beta \quad (11)$$

where $$X_P = \omega \cdot L_1 - \frac{1}{\omega \cdot C_1} \quad (12)$$

The quantities $\beta$ and $\gamma$ are therefore measured quantities.

From the measurements of magnitude and phase:

$$Re(Z_{in}) = |Z_{in}| \cdot \cos(\phi) \quad (13)$$

$$Im(Z_{in}) = |Z_{in}| \cdot \sin(\phi) \quad (14)$$

The quantities $R_1$ and $X_P$ are network constants which can be experimentally determined. The quantities on the left sides of equations (10) and (11) are therefore known during the matching process and the right sides appear to contain three unknowns M, α and $R_T$. However, in this particular case, there are only two independent variables since, if:

$$p = \frac{(\omega \cdot M)^2}{R_T} \text{ and } q = \frac{\alpha}{R_T} \quad (15,16)$$

one has:

$$Re(Z_{in}) - R_1 = \frac{p}{1 + q^2} = \gamma \quad (17)$$

$$Im(Z_{in}) - X_p = \frac{-p \cdot q}{1 + q^2} = -\beta \quad (18)$$

Equations (17) and (18) can be treated as two simultaneous equations in two unknowns, p and q, which are independently related to the match variables M and $L_2$. Thus, from the measured magnitude and phase the transformed control variables p and q can be used to independently control the match variables M and $L_2$. Solving (17) and (18) for p and q yields:

$$p = \frac{\beta^2 + \gamma^2}{\gamma} = \frac{(\omega \cdot M)^2}{R_T} \quad (19)$$

$$q = \frac{\beta}{\gamma} = \frac{\alpha}{R_T} \quad (20)$$

By constructing the control variables p and q from the measured quantities, β and γ, one can then independently control M and α for any given load.

When the system is in a matched condition, these two solutions (19,20) have definite numerical values which depend on the network's component values. Specifically, when matched:

$$\beta = X_p \text{ and } \gamma = 50 - R_1 \quad (21,22)$$

and hence:

$$p_o = \left(\frac{\beta^2 + \gamma^2}{\gamma}\right) = \frac{X_p^2 + (50 - R_1)^2}{50 - R_1} \quad (23)$$

and:

$$q_o = \left(\frac{\beta}{\gamma}\right) = \frac{X_p}{50 - R_1} \quad (24)$$

The numerical values of (23) and (24) can be arbitrarily subtracted from equations (19) and (20) to yield zero values of the functions when matching is achieved. The new, orthogonal functions are thus given by:

$$F = p - p_0 = \frac{\beta^2 + \gamma^2}{\gamma} - \left[\frac{X_p^2 + (50 - R_1)^2}{50 - R_1}\right] \quad (25)$$

and:

$$G = q - q_0 = \frac{\beta}{\gamma} - \frac{X_p}{50 - R_1} \quad (26)$$

Thus, the controller 320 of FIG. 3 is employed in this embodiment to generate values of F and G from the calibrated phase/magnitude detector signals $|Z_{in}|$ and φ and the match constants $R_1$ and $X_p$.

The values of F and G are dependent on only one of the match variables (M or $L_2$) so that a zero value of F can be reached by changing M only, and a zero value of G by changing $L_2$ only. The matched condition is reached when F and G are both zero.

The inputs of $R_1$, $X_p$, $|Z_{in}|$ and φ must be calibrated in this embodiment. The residual primary resistance $R_1$ can be measured along with $X_p$ at 13.56 MHz using a conventional network analyzer and $|Z_{in}|$ and φ are calibrated as in the prior art.

Figure 4:
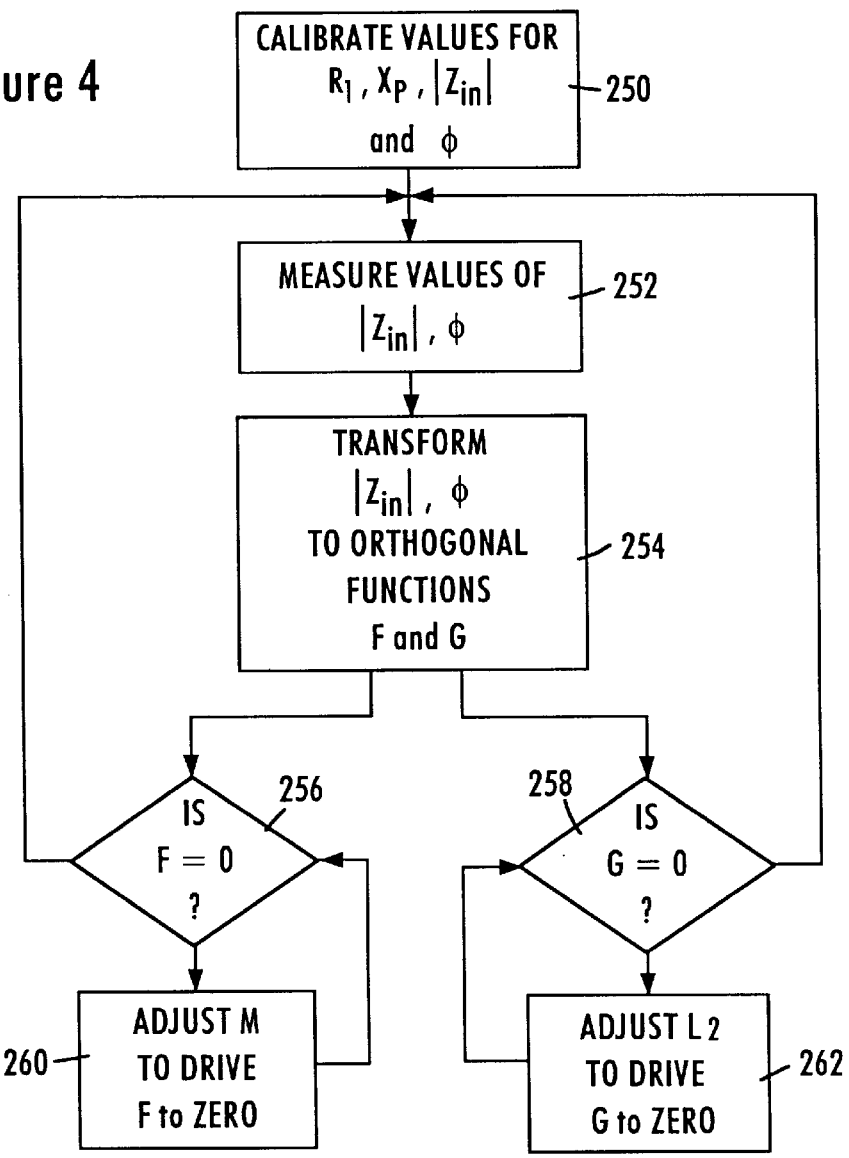
FIG. 4 is a flow chart of a method of matching a load in accordance with another embodiment of the present invention.

In the embodiment of the method of FIG. 4, the values for the inputs $R_1$, $X_p$, $|Z_{in}|$ and φ are calibrated, in step 250. In step 252, the values of $|Z_{in}|$ and φ are measured by the sensor 310, and provided to the driver controller 320. The measured values of $|Z_{in}|$ and φ are transformed by the driver controller 320 into two orthogonal functions F and G, in step 254. The values of both of these functions, based on the measured quantities $|Z_{in}|$, φ and the known constants of the circuit components, are then compared to specified values, in steps 256, 258. In preferred embodiments, and as depicted in FIG. 4, the specified value is zero for both F and G.

When the value of either F or G deviates from zero (or another specified value), the drive controller 320 drives a motor to adjust one or both of the match variables M and $L_2$, in steps 260, 262. Since both F and G are dependent on only one match variable (M or $L_2$), the match variables M, $L_2$ can be changed simultaneously to reach the matched condition. When the values of F and G are both zero (or another specified value), the matched condition has been achieved and the process returns to step 252 to monitor the values of $|Z_{in}|$ and φ.

The embodiment of the present invention depicted in FIG. 4 may also be applied to other match networks that employ different match variables. For example, in another match network, the match variables are M and $C_2$, instead of M and $L_2$. However, since $L_2$ and $C_2$ are both contained in the variable α, the transformation is essentially the same as described above. Hence, a separation of variables occurs and the orthogonal control functions F and G are generated from known and measured quantities.

Figure 5:
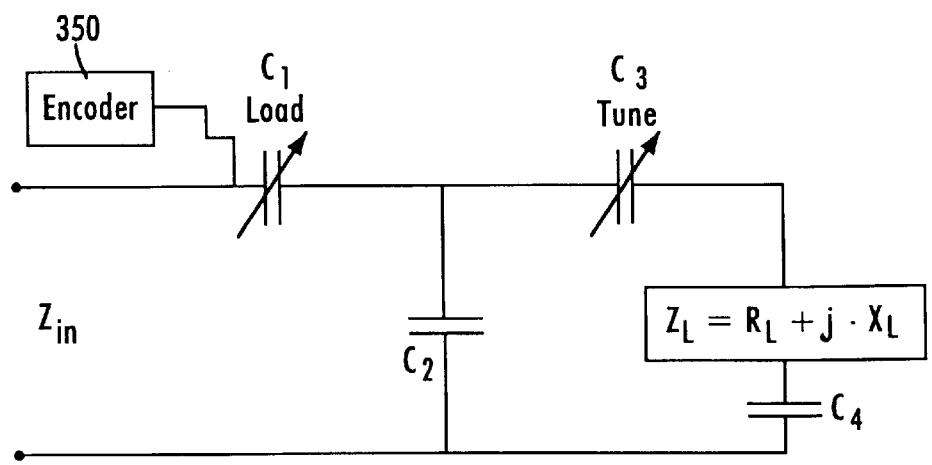
FIG. 5 is a schematic depiction of a match network constructed in accordance with another embodiment of the present invention.

Another embodiment of a match network is depicted in FIG. 5, this network being used to match inductive loads. In comparison to FIG. 1, the resistor-inductor-capacitor (RLC) arrangement is replaced by four capacitors $C_1$–$C_4$. Capacitors $C_1$ and $C_3$ are variable capacitors in this embodiment. The capacitances are varied by drive motors in response to signals from the drive controller 320. In the exemplary embodiment of FIG. 5, $C_1$ and $C_3$ can be varied in capacitance from 20 to 200 pF, $C_2$ has a value of 200 pF and $C_4$ has a value of 151 pF.

The change of variables described for the embodiment of FIG. 3 may also be performed for the embodiment of the match network of FIG. 5. However, the reduction of three apparently unknown quantities to two does not occur in this case due to the structure of the equations for the input impedance of the match. The result is that two equations emerge for the real and imaginary parts of the input impedance containing three unknown quantities.

For the match network embodiment of FIG. 5, one of the match variables must be measured. In exemplary embodiments, this measurement is accomplished using some form of encoder and capacitance calibration. The capacitors $C_1$ and $C_3$ are the load and tune components controlled by the magnitude and phase error signals. The matching range capability using the component values shown is approximately 1 to 10 ohms (real) and 200 to 500 ohms (inductive).

Figure 6A:
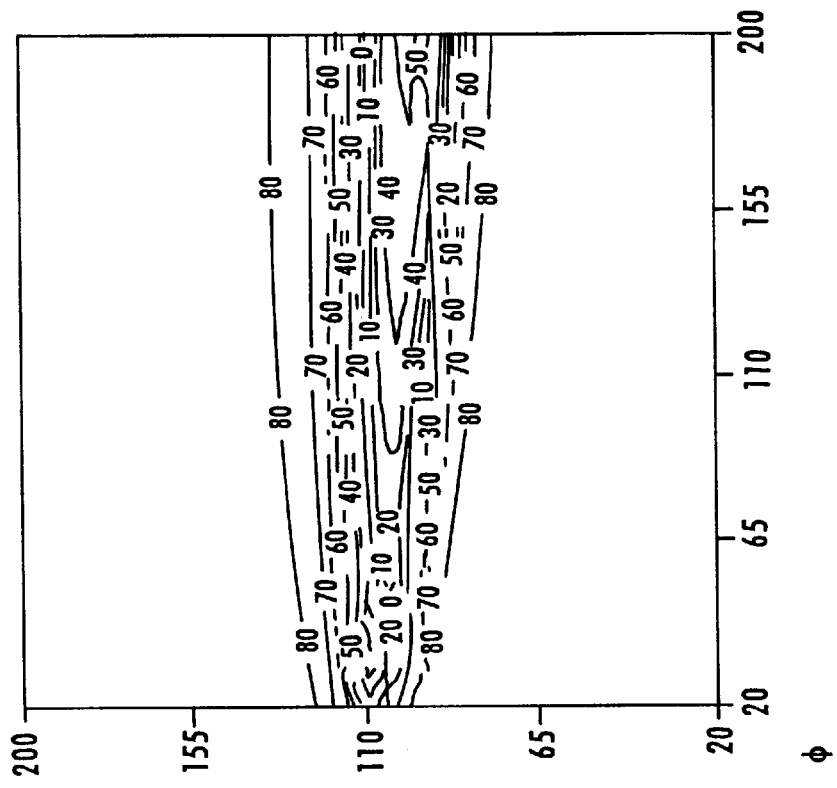
FIGS. 6A and 6B are a plot of the contours for ($|Z|$) and $\phi$ for the match network of FIG. 5.
Figure 6B:
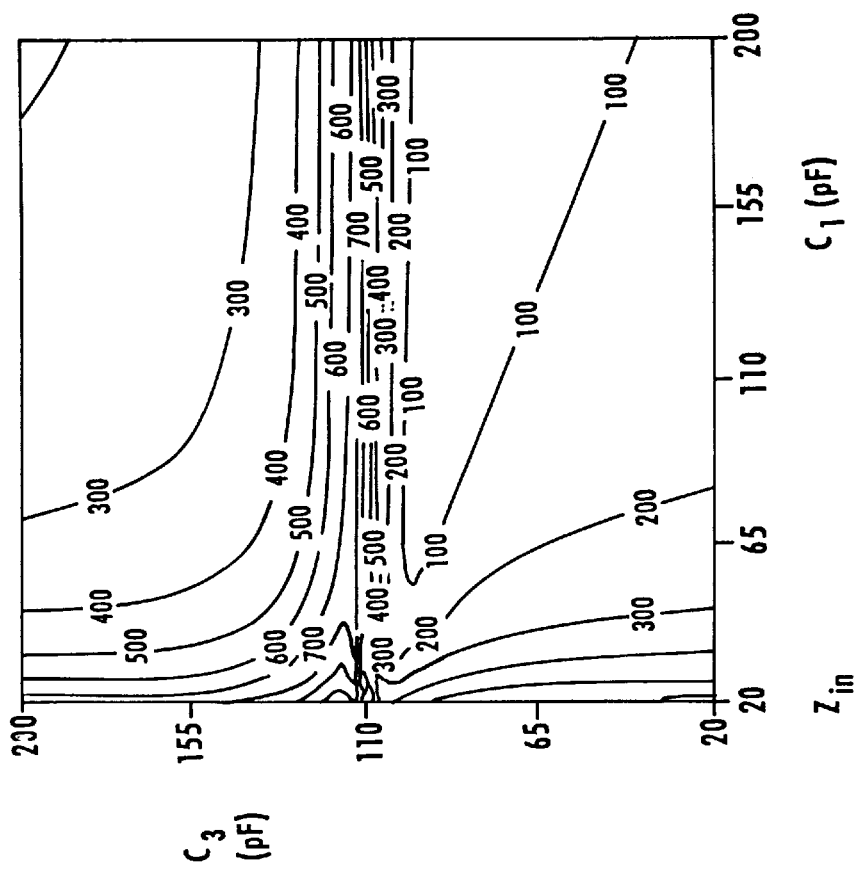
Figure 7A:
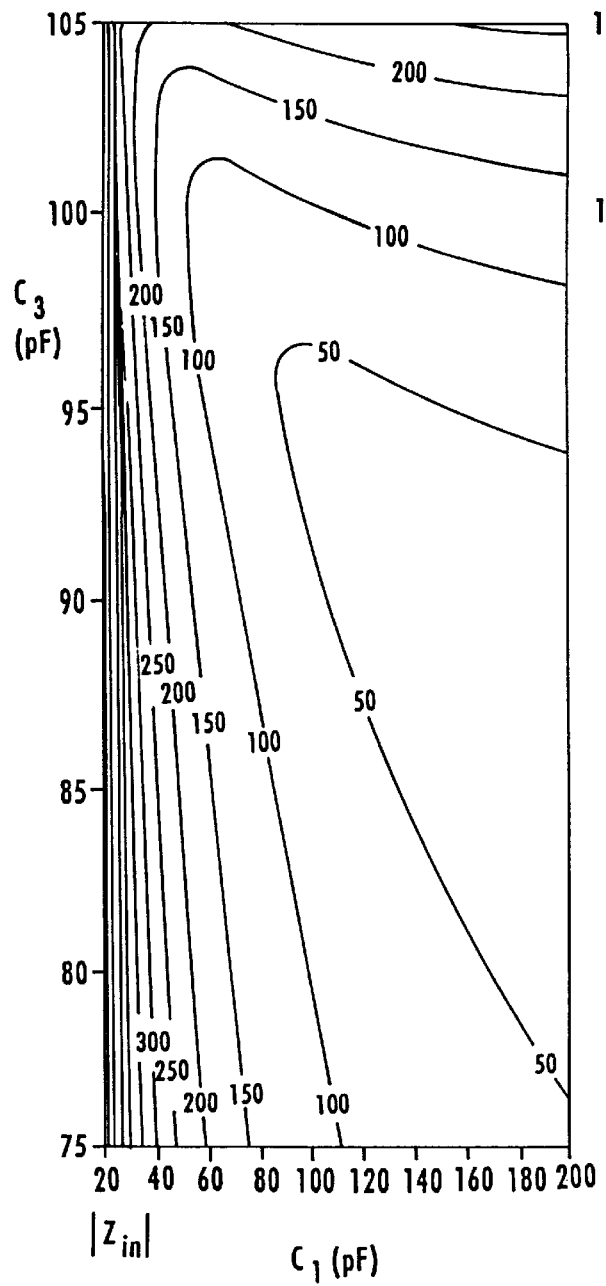
FIGS. 7A and 7B are an enlarged view of FIG. 6 in the matching region.
Figure 7B:
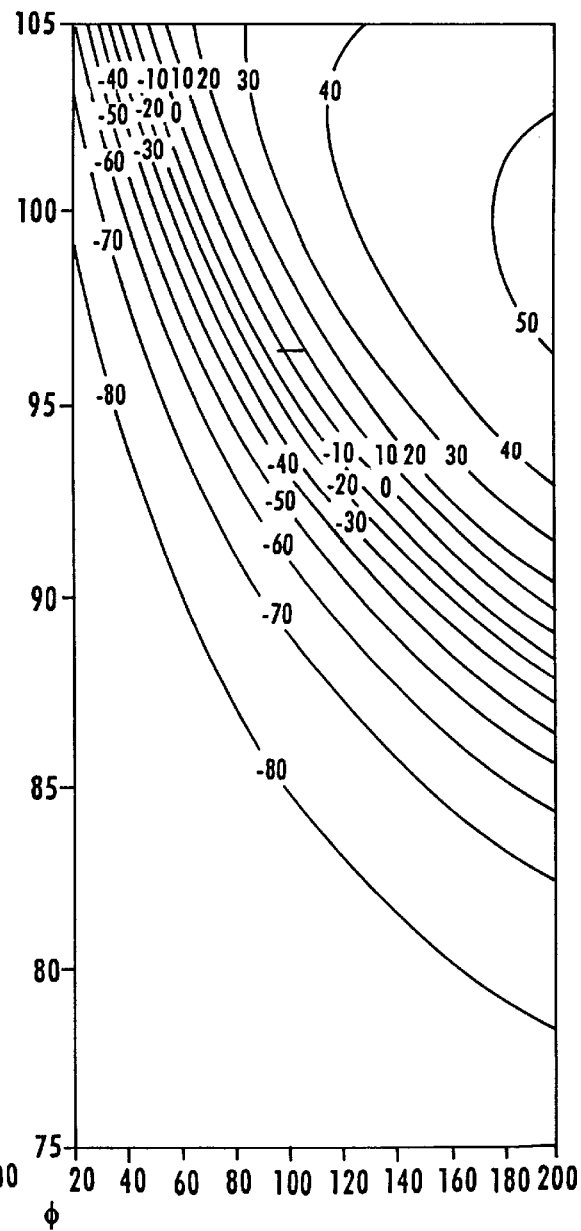

Despite the need to measure $C_1$ or $C_3$, considerable simplification can be derived by transforming the measured variables, as will be seen. Typical match response contours are shown in FIGS. 6 and 7 for a load impedance of R=5+j240 ohms. Here the magnitude error and phase error signals control $C_1$ and $C_3$ respectively. The response surface is complicated, particularly for the magnitude, which is also dual valued. The match could search for a 50 ohm contour at high values of $C_3$ rather than at lower values where the match condition occurs. FIG. 7 is a view of the match region of FIG. 6 expanded for clarity. Note that the 50 ohm line in FIG. 7 does not appear in FIG. 6 as a result of the nature of the plotting algorithm. The complexity of FIG. 6 may be compared to the simplicity of FIG. 8, which depicts the response contours after the transformation and which corresponds to the same load. The coordinates of $C_1$, $C_3$ at the matched condition are the same in FIGS. 6–8 ($C_1$=97.8 pF and $C_3$=96.6 pF).

The input impedance of the match network and load for the embodiment of FIG. 5 is given by:

$$Re(Z_{in}) = \frac{R_L \cdot x_2^2}{R_L^2 + \alpha^2} \tag{27}$$

$$Im(Z_{in}) = (x_1 + x_2) - \frac{x_2^2 \cdot \alpha}{R_L^2 + \alpha^2} \tag{28}$$

where:

$$\alpha = X_L - x_2 - x_3 - x_4 \tag{29}$$

and:

$$x_n = \frac{1}{\omega \cdot C_n} \tag{30}$$

for the four capacitors $C_1$ through $C_4$. Equation (27) is not dependent on $C_1$ but only upon $C_3$ (through $\alpha$) and the load. Thus, using $Re(Z_{in})$ rather than $|Z_{in}|$ as one control signal would lead to linearization in the $C_1$, $C_3$ space. However, solutions for $C_3$ would again be dual valued due to the quadratic nature of equation 27 leading to possible searching anomalies. Equations (27) and (28) may again be treated simultaneously but for the term $-(x_1+x_2)$ in equation (28). Although $x_2$ is fixed and known, the match variable $x_1$ is usually not known. This term prevents the reduction to two variables and the simplicity of the embodiment of FIG. 3 becomes unavailable. However, in the embodiment of FIG. 5, an independent measurement of $C_1$ is made by an encoder 350. Because of this, the $-(x_1+x_2)$ term can be joined with the measured value of $Im(Z_{in})$ and the equations solved. Denoting:

$$RZ = Re(Z_{in}) \text{ and } IZ = Im(Z_{in}) + x_1 + x_2 \tag{31,32}$$

then:

$$\frac{RZ}{x_2^2} = \frac{R_L}{R_L^2 + \alpha^2} \text{ and } \frac{IZ}{x_2^2} = \frac{\alpha}{R_L^2 + \alpha^2} \tag{33,34}$$

from which:

$$R_L = \frac{x_2^2}{RZ} \cdot \frac{1}{\left[1 + \left(\frac{IZ}{RZ}\right)^2\right]} \tag{35}$$

and:

$$\alpha = -\frac{IZ}{RZ^2} \cdot x_2^2 \cdot \frac{1}{\left[1 + \left(\frac{IZ}{RZ}\right)^2\right]} \tag{36}$$

Equations (35) and (36) form the basis of the new control variables but must first be corrected for their values when a match is achieved to assign a value of zero to those contour lines. When a match is made RZ is equal to 50 ohms and $Im(Z_{in})$ is zero so IZ equals $x_1+x_2$. The new control variables can thus be defined as:

$$F = \frac{x_2^2}{RZ} \cdot \frac{1}{\left[1 + \left(\frac{IZ}{RZ}\right)^2\right]} - \frac{x_2^2}{50} \tag{37}$$

$$G = \frac{IZ}{RZ^2} \cdot x_2^2 \cdot \frac{1}{\left[1 + \left(\frac{IZ}{RZ}\right)^2\right]} + \frac{1}{\left[1 + \left(\frac{x_1 + x_2}{50}\right)^2\right]}$$

$$\frac{(x_1 + x_2)}{2500} \cdot x_2^2 \cdot \frac{1}{\left[1 + \left(\frac{x_1 + x_2}{50}\right)^2\right]} \tag{38}$$

Figure 8B:
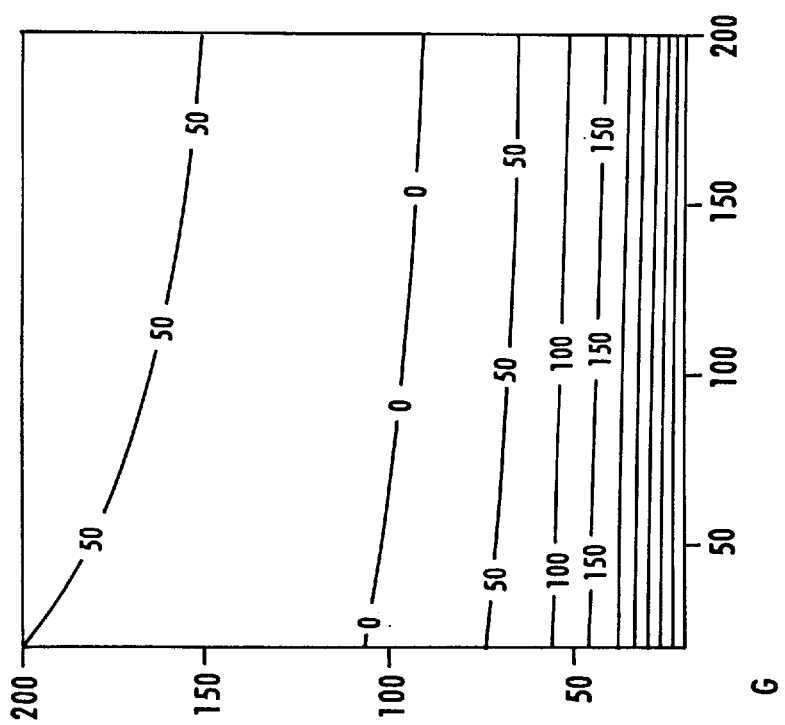
FIGS. 8A and 8B are a plot of nearly orthogonal functions for the match network of FIG. 5 generated according to embodiments of the present invention.
Figure 8A:
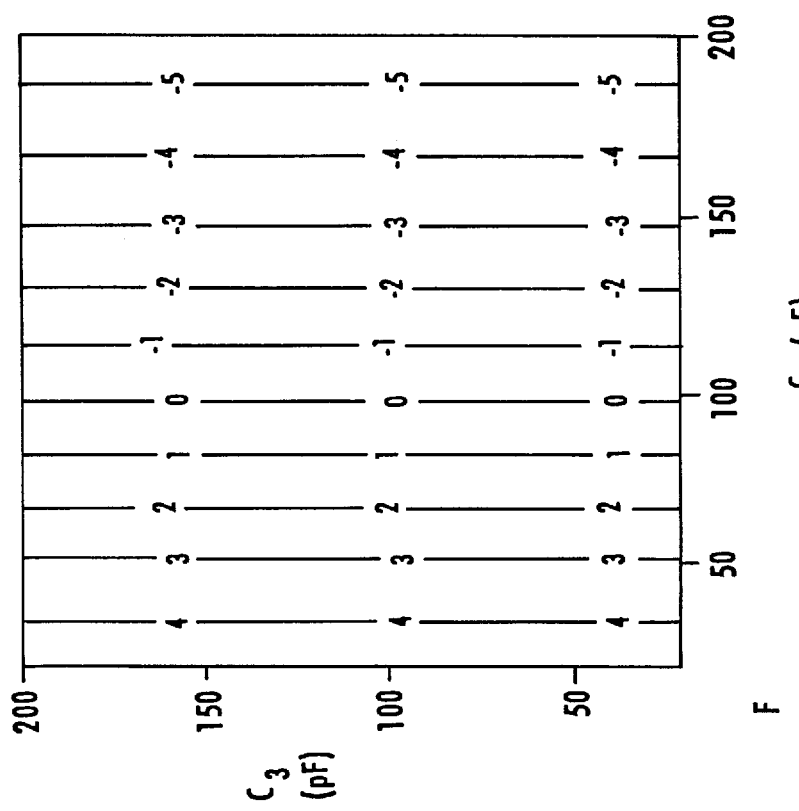

Hence, by making an additional measurement of $x_1$ (i.e., $C_1$), then all of the quantities on the right hand side of equations (37) and (38) are known and F and G can be computed as control variables. FIG. 8 depicts the contours of F and G in the space of the match variables $C_1$ and $C_3$. The contours of G are not parallel to the $C_1$ axis due to the zeroing out of the function which introduces an $x_1$ ($C_1$) dependence. However, the linearization is much improved over FIG. 6. The dual values of the control function have been removed in this formulation and no ambiguity remains. Finally, changes in the real and imaginary components of the load lead to changes in the contours of F and G respectively, but not both. For example, as $R_T$ increases, the contours of F move to the right and those of G remain unchanged. Similarly, as $X_L$ changes only the contours of G change. This separation of variables leads to a simple and unambiguous matching procedure.

Figure 9:
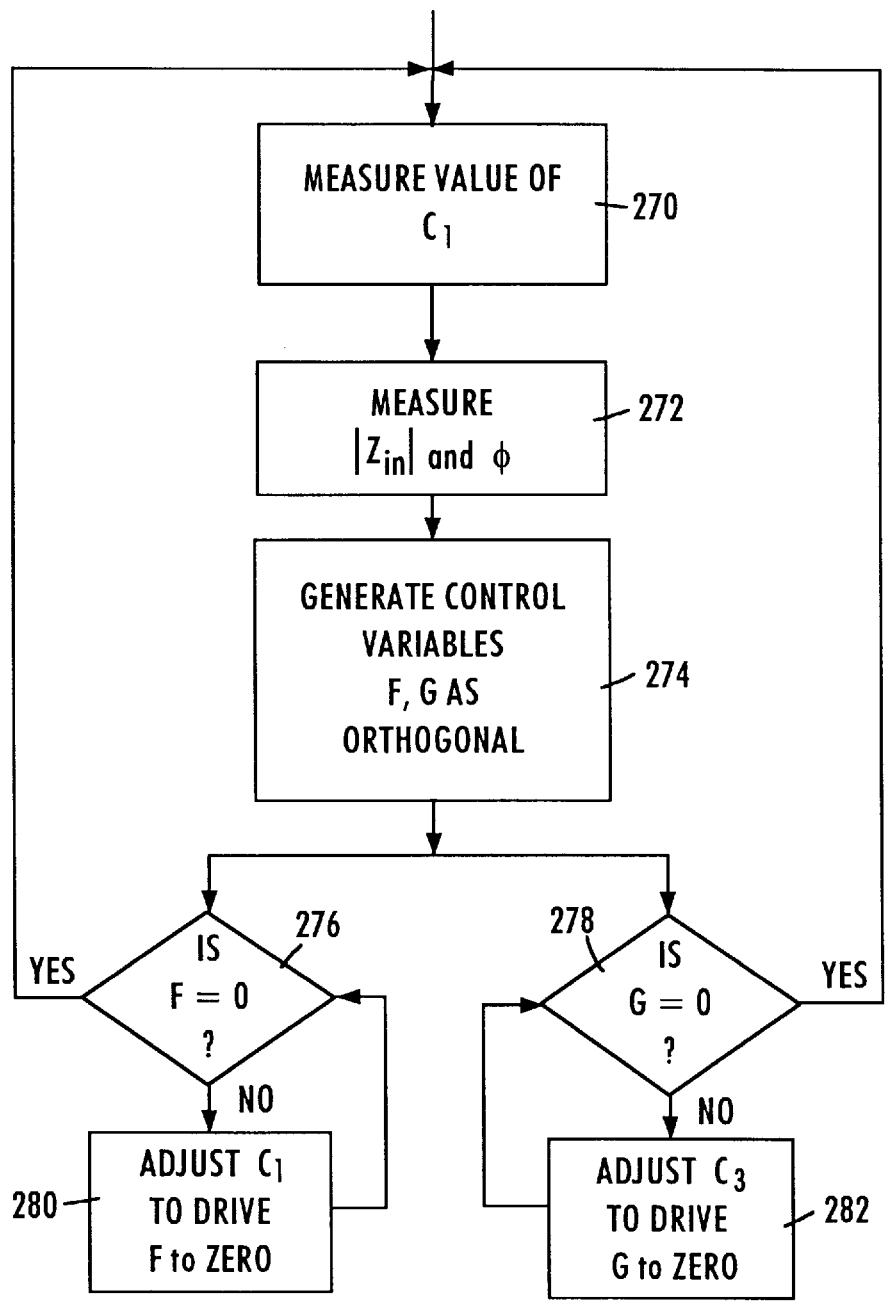
FIG. 9 is a flow chart of a method of matching a load in accordance with another embodiment of the present invention.

An embodiment of a method of matching for the network of FIG. 5 is depicted in FIG. 9. In step 270, an independent measurement of the value of $C_1$ is performed using an encoder, for example. The values of $|Z_{in}|$ and $\phi$ are measured in step 272 by the sensor 310, and provided to the driver controller 320. Based on this measured value of $C_1$, a pair of control variables (F, G) are generated as nearly orthogonal functions by the drive controller 320 in step 274. The values of both of these control variables are then compared to a specified value, in steps 276, 278. In preferred embodiments, the specified value is zero.

When the value of either F or G deviates from zero, the drive controller 320 drives a motor to adjust one or both of the match variables $C_1$ and $C_3$, in steps 280, 282. Since both F and G are primarily dependent on only one match variable ($C_1$ or $C_3$), the matched variables can be changed simultaneously to reach the matched condition. When the values of F and G are both zero, the matched condition has been achieved and the process returns to step 270.

Another embodiment of the present invention employs a power and impedance sensor, such as are commercially available, between the match network and the plasma chamber. Such a sensor could be used in several ways to assist the matching process if an appropriate feedback control loop is also implemented. One such method uses the sensor and feedback loop to maintain the power to the plasma load at a constant level during the matching process. This would maintain the load impedance at a nearly constant level which was assumed in the calculations, for example, of FIG. 8. An alternate embodiment uses the sensor to constantly monitor the real and imaginary parts of the load impedance and uses their values to determine the desired settings of the match variables necessary to achieve a matched condition. These methods could also be employed to enhance the other embodiments of the match control algorithm already described.

A number of different embodiments of a match network have been described above, as well as methods for achieving the matched condition with these networks by independent control of two control variables. As will be appreciated by one of ordinary skill in the art, the embodiments described above are exemplary only. The present invention is applicable to other types of match networks, such as networks in which other control variables are provided.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. Apparatus for matching a load to a power source, comprising:
    a match network coupled between a power source and a load, the match network having at least two controllable variable electrical characteristics;
    a sensor for sensing at least two electric parameters determined by impedances of the load and match network,
    a drive controller responsive to the sensed parameters of the load for independently controlling a first one of the electrical characteristics of the match network as a function of only one of the parameters of the load and a second one of the electrical characteristics of the match network as a function of only another one of the parameters of the load until the power source and the load are matched.

2. The apparatus of claim 1, wherein the match network includes a primary circuit and a secondary circuit, the primary circuit being in a resonant condition at an operating frequency of the power source.

3. The apparatus of claim 2, wherein the match network includes a first inductor in the primary circuit and a second inductor in the secondary circuit, a mutual inductance being between the first and second inductors, and the first and second electrical characteristics respectively including (a) the mutual inductance between the first and second inductors and (b) the inductance of the second inductor.

4. The apparatus of claim 3, wherein the parameters include magnitude of the impedance seen looking from the source into the match network and phase angle between the voltage current coupled between the source and match network, and the drive controller includes means for determining a measure of deviation of the mutual inductance solely as a function of the magnitude of the impedance and a measure of deviation of the secondary inductance solely as a function of the phase angle.

5. The apparatus of claim 1, wherein the match network includes a primary circuit and a secondary circuit, the primary circuit including a first inductor, the secondary circuit including a second inductor, and the controllable variable electrical characteristics include the inductance of the second inductor and mutual inductance between the first and second inductors.

6. The apparatus of claim 5, wherein the parameters include magnitude of the impedance looking from the source into the match network and phase angle between the voltage and current coupled between the source and match network, and the drive controller includes means for transforming the parameters into first and second control variables, the first control variable having a one-to-one correspondence with the mutual inductance and the second control variable having a one-to-one correspondence with the inductance of the second inductor.

7. The apparatus of claim 1, wherein the match network includes a primary circuit and a secondary circuit, the primary circuit including a first inductor, the secondary circuit including a second inductor and a capacitors, the controllable variable electrical characteristics including the capacitance of the second capacitor and mutual inductance between the first and second inductors.

8. The apparatus of claim 7, wherein the parameters of the load include magnitude of the impedance seen looking from the source into the match network and phase angle between the voltage and current coupled between the source and match network, the drive controller including means for transforming the parameters into first and second control variables, the first control variable having a one-to-one correspondence with the mutual inductance and the second control variable having a one-to-one correspondence with the capacitance of the second capacitor.

9. The apparatus of claim 1, wherein the match network includes a load capacitor and a tune capacitor, and the controllable variable electrical characteristics include the capacitance of the load capacitor and the capacitance of the tune capacitor.

10. The apparatus of claim 9, further including an encoder for measuring parameters of the load including magnitude and phase, and the drive controller including means for transforming the parameters into first and second control variables, the first control variable having a nearly one-to-one correspondence with the mutual inductance and the second control variable having a one-to-one correspondence with the capacitance of the second capacitor.

11. A method of matching a load to a power source with a match network having a primary circuit and a secondary circuit, comprising the steps of:
    establishing a resonant condition in the primary circuit;
    measuring at least two parameters of the load;
    calculating a control variable from at least one of the parameters;
    determining whether a first one of the load parameters is equal to a first specified value based on the value of the control variable;
    adjusting a first match variable of the match network to drive the control variable such that the first load parameter is equal to the first specified value;
    determining whether a second one of the load parameters is equal to a second specified value; and
    adjusting a second match variable of the match network to drive the match variable such that the second load parameter is equal to the second specified value, wherein the first match variable has a one-to-one correspondence with the first load parameter and the second match variable has a one-to-one correspondence with the second load parameter.

12. The method of claim 11, wherein the first load parameter is the reactive impedance of the load, the second load parameter is the resistive impedance of the load, the first match variable is a secondary inductance in the match network, and the second match variable is a mutual inductance in the match network.

13. A method of matching a load to a power source with a match network having a primary circuit and a secondary circuit, comprising the steps of:
    measuring at least two parameters of the load;

transforming the two parameters of the load into first and second nearly orthogonal functions; and simultaneously and independently adjusting a first match variable of the match network to drive the value of the first orthogonal function to a first specified value, and a second match variable of the match network to drive the value of the second orthogonal function to a second specified value.

14. The method of claim 13, wherein the first load parameter is the resistive impedance of the load, the second load parameter is the reactive impedance of the load, the first match variable is mutual inductance in the match network, and the second match variable is secondary inductance in the match network.

15. The method of claim 13, wherein the first load parameter is the resistive impedance of the load, the second load parameter is the reactive impedance of the load, the first match variable is mutual inductance in the match network, and the second match variable is a capacitance of a capacitor in the match network.

16. The method of claim 13, further comprising measuring a value of a first capacitor in the match network, wherein determinations of whether (a) the value of a first one of the functions is equal to a first specified value and (b) the value of a second one of the functions is equal to a second specified value by incorporating the measured value of the first capacitor in the match network.

17. The method of claim 16, wherein the first load parameter is the resistive impedance of the load, the second load parameter is the reactive impedance of the load, the first match variable is the capacitance of the first capacitor in the match network, and the second match variable is the capacitance of a second capacitor in the match network.

18. A method of impedance matching a load to a source with a matching network having first and second variable electric characteristics, the matching network being connected between the source and load, the method comprising monitoring first and second electric parameters determined by impedances of the load and matching network, manipulating the first and second electric parameters to derive first and second control functions for the first and second variable electric characteristics, the first control function being only for the first variable electric characteristic, the second control function being only for the second variable electric characteristic, and obtaining an impedance match between the load and source by controlling (a) the first variable characteristic in response to the first control function independently of the second variable characteristic, and (b) the second variable characteristic in response to the second control function independently of the first variable characteristic, the manipulations of the manipulating step enabling the match to be obtained by the controlling step.

19. The method of claim 18 wherein the first and second electric parameters are respectively (a) the magnitude of impedance seen looking from the source into the matching network and (b) the phase angle between voltage and current supplied by the source to the matching network.

20. The method of claim 19 wherein the matching network includes a transformer having a variable mutual inductance and a variable reactance, the variable reactance being the first variable electric characteristic, the variable mutual inductance being the second variable electric characteristic.

21. The method of claim 20 further including establishing a resonant condition in a circuit including a primary winding connected to be responsive to the source prior to performing the first and second control functions, performing the first control function by adjusting the variable reactance so the current and voltage supplied by the source to the primary winding are substantially in phase, and performing the second control function by varying the mutual inductance until the impedance magnitude seen looking from the source into a circuit including the transformer primary winding has a predetermined value, the first and second control functions being performed sequentially and in such a manner that the source and load are matched after the first and second control functions are sequentially performed, without repeating either of the control functions.

22. The method of claim 20 further including adjusting the values of resistance and reactance seen looking into a circuit including a primary winding of the transformer driven by the source to predetermined values, and adjusting the magnitude to a predetermined value, then measuring the magnitude of impedance seen looking from the source into the circuit including the transformer primary winding and the phase angle between current and voltage applied by the source to the circuit including the transformer primary winding, then transforming the measured values of impedance magnitude and phase angle into first and second nearly orthogonal functions the first control function being performed by adjusting the value of the mutual inductance until the first function has a predetermined value, second control function being performed by adjusting the variable reactance until the second function has a predetermined value.

23. The method of claim 22 wherein the first and second control functions are performed simultaneously.

24. The method of claim 23 wherein the first and second nearly orthogonal functions F and G are respectively different functions of (1) the desired value for the magnitude of impedance seen looking from the source into the matching network, ($|Z_o|$), (2) the values of the reactance ($X_p$) and resistance ($R_1$) seen looking from the source into the matching network, (3) the real component of impedance seen looking from the source into the matching network ($Re(Z_{in})$) minus the resistance of the primary winding circuit ($R_1$) and (4) the imaginary component of impedance seen looking from the source into the matching network ($Im(Z_{in})$) minus the reactance of the primary winding circuit ($X_p$).

25. The method of claim 24 wherein $$F = \beta^2 + \gamma - \frac{X_p^2 + (Z_o - R_1)}{Z_o - R_1} \text{ and } G = \frac{\beta}{\gamma} - \frac{X_p}{Z_o - R_1}$$

where:

$\gamma = Re(Z_{in}) - R_1$ $\beta = X_p - Im(Z_{in})$.

26. The method of claim 19 wherein the matching network includes first and second variable reactances respectively comprising the first and second variable electric characteristics, the first and second variable reactances being respectively connected in different legs of the matching network, the first reactance primarily controlling loading of the source, the second reactance primarily controlling timing the load to the source, the method further comprising determining values of (a) at least one of the reactances, (b) the magnitude of the impedance seen looking from the source into the matching network and (c) the phase angle between the voltage and current supplied by the source to the matching network, deriving the first and second control functions in response to the determined values, the first and second control functions being at least nearly orthogonal, the first and second control functions respectively controlling the values of the first and second reactances.

27. The method of claim 26 wherein the first and second control functions are performed simultaneously.

28. The method of claim 26 wherein the first and second orthogonal control functions are different functions of the real component of impedance seen looking into the matching network, the imaginary component of impedance seen looking into the matching network, the desired impedance magnitude seen looking into the matching network, and the impedance values of the first and second reactances.

* * * * *